United States Patent
Taylor et al.

(10) Patent No.: US 7,241,487 B2
(45) Date of Patent: Jul. 10, 2007

(54) POLYCARBOXYL/POLYOL FIBERGLASS BINDER

(75) Inventors: Thomas J. Taylor, Englewood, CO (US); Derek C. Bristol, Boulder, CO (US)

(73) Assignee: Johns Manville International, Inc., Denver, CO (US)

( * ) Notice: Subject to any disclaimer, the term of this patent is extended or adjusted under 35 U.S.C. 154(b) by 41 days.

(21) Appl. No.: 11/289,843

(22) Filed: Nov. 30, 2005

(65) Prior Publication Data

US 2006/0079629 A1   Apr. 13, 2006

Related U.S. Application Data

(63) Continuation of application No. 10/038,739, filed on Jan. 2, 2002, now Pat. No. 7,067,579, which is a continuation of application No. 09/165,569, filed on Oct. 2, 1998, now abandoned.

(51) Int. Cl.
*B32B 27/12* (2006.01)
(52) U.S. Cl. .................... 428/299.4; 524/503; 524/556
(58) Field of Classification Search ............. 428/299.4; 524/503, 556
See application file for complete search history.

(56) References Cited

U.S. PATENT DOCUMENTS

| | | | | | |
|---|---|---|---|---|---|
| 3,387,061 | A | * | 6/1968 | Smith et al. | 525/187 |
| 5,318,990 | A | * | 6/1994 | Strauss | 524/549 |
| 5,427,587 | A | * | 6/1995 | Arkens et al. | 8/116.1 |
| 5,661,213 | A | * | 8/1997 | Arkens et al. | 524/555 |
| 5,763,524 | A | * | 6/1998 | Arkens et al. | 524/547 |
| 6,071,994 | A | * | 6/2000 | Hummerich et al. | 524/247 |
| 6,136,916 | A | * | 10/2000 | Arkens et al. | 524/556 |
| 6,274,661 | B1 | * | 8/2001 | Chen et al. | 524/388 |
| 6,331,350 | B1 | * | 12/2001 | Taylor et al. | 428/221 |

* cited by examiner

*Primary Examiner*—Bernard Lipman
(74) *Attorney, Agent, or Firm*—Robert D. Touslee; Timothy G. Hofmeyer

(57) ABSTRACT

Provided is a novel fiberglass binder comprising a polycarboxy polymer and a polyol. The amount of polycarboxy polymer and polyol contained in the binder is such that the ratio of equivalents of hydroxyl groups to carboxy groups is preferably in the range from about 0.6/1 to 0.8/1. It is further preferred that the molecular weight of the polycarboxy polymer is less than 10,000, and more preferably less than 5000.

14 Claims, No Drawings

POLYCARBOXYL/POLYOL FIBERGLASS BINDER

The present application is a continuation of U.S. patent application Ser. No. 10/038,739, filed Jan. 2, 2002, now U.S. Pat. No. 7,067,579, which is in turn a continuation of U.S. patent application Ser. No. 09/165,569, filed Oct. 2, 1998, now abandoned.

FIELD OF THE INVENTION

The subject invention pertains to polycarboxy polymer binding resins. More particularly, the subject invention pertains to thermosetting, acrylic acid-based binder resins which cure by crosslinking with a poly-functional, carboxyl group-reactive curing agent. Such binders are useful as replacements for formaldehyde-based binders in non-woven fiberglass goods.

BACKGROUND OF THE INVENTION

Fiberglass binders have a variety of uses ranging from stiffening applications where the binder is applied to woven or non-woven fiberglass sheet goods and cured, producing a stiffer product; thermo-forming applications wherein the binder resin is applied to a sheet or lofty fibrous product, following which it is dried and optionally B-staged to form an intermediate but yet curable product; and to fully cured systems such as building insulation.

Fibrous glass insulation products generally comprise matted glass fibers bonded together by a cured thermoset polymeric material. Molten streams of glass are drawn into fibers of random lengths and blown into a forming chamber where they are randomly deposited as a mat onto a traveling conveyor. The fibers, while in transit in the forming chamber and while still hot from the drawing operation, are sprayed with an aqueous binder. A phenol-formaldehyde binder is currently used throughout the fibrous glass insulation industry. The residual heat from the glass fibers and the flow of air through the fibrous mat during the forming operation are generally sufficient to volatilize the majority to all of the water from the binder, thereby leaving the remaining components of the binder on the fibers as a viscous or semi-viscous high solids liquid. The coated fibrous mat is then transferred out of the forming chamber to a curing oven where heated air, for example, is blown through the mat to cure the binder and rigidly bond the glass fibers together.

Fiberglass binders used in the present sense should not be confused with matrix resins which are an entirely different and a non-analogous field of art. While sometimes termed "binders", matrix resins act to fill the entire interstitial space between fibers, resulting in a dense, fiber reinforced product where the matrix must translate the fiber strength properties to the composite, whereas "binder resins" as used herein are not space-filling, but rather coat only the fibers, and particularly the junctions of fibers. Fiberglass binders also cannot be equated with paper or wood product "binders" where the adhesive properties are tailored to the chemical nature of the cellulosic substrates. Many such resins, e.g. urea/formaldehyde and resorcinol/formaldehyde resins, are not suitable for use as fiberglass binders. One skilled in the art of fiberglass binders would not look to cellulosic binders to solve any of the known problems associated with fiberglass binders.

Binders useful in fiberglass insulation products generally require a low viscosity in the uncured state, yet characteristics so as to form a rigid thermoset polymeric mat for the glass fibers when cured. A low binder viscosity in the uncured state is required to allow the mat to be sized correctly. Also, various binders tend to be tacky or sticky and hence they lead to accumulation of fibers on the forming chamber walls. This accumulated fiber may later fall onto the mat causing dense areas and product problems. A binder which forms a rigid matrix when cured is required so that a finished fiberglass thermal insulation product, when compressed for packaging and shipping, will recover to its specified vertical dimension when installed in a building.

From among the many thermosetting polymers, numerous candidates for suitable thermosetting fiber-glass binder resins exist. However, binder-coated fiberglass products are often of the commodity type, and thus cost becomes a driving factor, generally ruling out such resins as thermosetting polyurethanes, epoxies, and others. Due to their excellent cost/performance ratio, the resins of choice in the past have been phenol/formaldehyde resins. Phenol/formaldehyde resins can be economically produced, and can be extended with urea prior to use as a binder in many applications. Such urea-extended phenol/formaldehyde binders have been the mainstay of the fiberglass insulation industry for years.

Over the past several decades however, minimization of volatile organic compound emissions (VOCs) both on the part of the industry desiring to provide a cleaner environment, as well as by Federal regulation, has led to extensive investigations into not only reducing emissions from the current formaldehyde-based binders, but also into candidate replacement binders, For example, subtle changes in the ratios of phenol to formaldehyde in the preparation of the basic phenol/formaldehyde resole resins, changes in catalysts, and addition of different and multiple formaldehyde scavengers, has resulted in considerable improvement in emissions from phenol/formaldehyde binders as compared with the binders previously used. However, with increasingly stringent Federal regulations, more and more attention has been paid to alternative binder systems which are free from formaldehyde.

One such candidate binder system employs polymers of acrylic acid as a first component, and a polyol such as glycerine or a modestly oxyalkylated glycerine as a is curing or "crosslinking" component. The preparation and properties of such poly(acrylic acid)-based binders, including information relative to the VOC emissions, and a comparison of binder properties versus urea formaldehyde binders is presented in "Formaldehyde-Free Crosslinking Binders For Non-Wovens", Charles T. Arkins et al., TAPPI JOURNAL, Vol. 78, No. 11, pages 161–168, November 1995. The binders disclosed by the Arkins article, appear to be B-stageable as well as being able to provide physical properties similar to those of urea/formaldehyde resins. Unfortunately, urea/formaldehyde resins do not in general offer the same properties as phenol/formaldehyde resins, the most widely used fiberglass binder resins.

U.S. Pat. No. 5,340,868 discloses fiberglass insulation products cured with a combination of a polycarboxy polymer, a β-hydroxyalkylamide, and an at least trifunctional monomeric carboxylic acid such as citric acid. The specific polycarboxy polymers disclosed are poly(acrylic acid) polymers.

U.S. Pat. No. 5,318,990 discloses a fibrous glass binder which comprises a polycarboxy polymer, a monomeric trihydric alcohol and a catalyst comprising an alkali metal salt of a phosphorous-containing organic acid.

Published European Patent Application EP 0 583 086 A1 appears to provide details of polyacrylic acid binders whose cure is catalyzed by a phosphorus-containing catalyst system as discussed in the Arkins article previously cited. European Published Application EP 0 651 088 A1 contains a related disclosure pertaining to cellulosic substrate binders. The fiber-glass binders of EP '086 are partially neutralized polycarboxy polymers and hydroxyl-functional curing agents wherein the polycarboxy polymers are prepared in presence of sodium hypophosphite, incorporating the latter into the polymer structure or by incorporating sodium hypophosphite separately into the curable mixture of polycarboxy polymers to serve as the curing catalyst. Polymers of acrylic acid and maleic acid are exemplified, but appear to reduce both dry and wet tensile strength as compared to poly (acrylic acid) catalyzed with sodium hypophosphite. Higher molecular weight poly(acrylic acids) are stated to provide polymers exhibiting more complete cure. See also U.S. Pat. No. 5,661,213.

Further, as Arkins indicates, the normal cure temperature of the acrylic binder resins is approximately 180° C., and a final cure does not take place without prolonged heating at this temperature or by allowing the temperature to rise to the range of 220° C. to 240° C. The combination of curing temperature and cure time necessitates thermal energy requirements considerably in excess of what is normally desirable for phenol/formaldehyde resins. While it might seem that a simple increase in oven temperature could provide the additional thermal energy required, it must be remembered that in a commercial setting, the exceptionally large ovens, powerful heat supplies, and ancillary equipment must all be changed if a binder with higher thermal energy curing requirements is to be used. These changes are not minimal, and represent a considerable financial investment, in many cases requiring significant additional furnace length. Moreover, it is highly likely that for a considerable period of time at least, a variety of binder resins may be used on the same line at different times. Thus, any change made to the curing ovens must be easily reversible. Thus, poly (acrylic acid) binder systems having curing energy requirements similar to those of phenol/formaldehyde binders would be desirable.

While some polycarboxy polymers have been found useful for making fiberglass insulation products, problems have been observed in the processing of the products. Clumping or sticking of glass fibers to the inside of the forming chambers during the processing has been one major problem. As well, it is important that the final product exhibit the recovery and rigidity necessary to provide a commercially acceptable fiberglass insulation product.

Accordingly, it is an objective of the present invention to provide a non-phenol formaldehyde binder.

Yet another object of the present invention is to provide such a binder which allows one to prepare fiberglass insulation products with minimal processing difficulties.

Still another object of the present invention is to provide a fiberglass insulation product which exhibits good recovery and rigidity, and is formaldehyde-free.

These and other objects of the present invention will become apparent to the skilled artisan upon a review of the following description and the claims appended thereto.

SUMMARY OF THE INVENTION

In accordance with the foregoing objectives, there is provided by the present invention a novel fiberglass binder. The binder of the present invention comprises a polycarboxy polymer and a polyol. It is also preferred that the binder comprises a catalyst, such as an alkaline metal salt of a phosphorus-containing organic acid.

An important aspect of the binder of the present invention is that the amount of polycarboxy polymer and polyol contained in the binder is such that the ratio of equivalents of hydroxyl groups to equivalents of carboxy groups is in the range of from about 0.4/1 to 1.0/1; more preferably from about 0.6/1 to 0.8/1; and most preferably from about 0.65/1 to 0.75/1.

It is further preferred that the molecular weight of the polycarboxy polymer is less than 10,000, more preferably less than 5000, and most preferably around 3000 or less, with around 2000 being most advantageous.

The use of such a low molecular weight polycarboxy polymer in the binder with the required high hydroxyl/carboxy ratio, results in a binder which exhibits few, if any, processing difficulties when preparing a fiberglass product. Sticking and balling of the fiberglass fibers during the preparation of the fiberglass mat become of minimal concern. The resulting product also exhibits excellent recovery and rigidity properties.

DETAILED DESCRIPTION OF THE PREFERRED EMBODIMENTS

The polycarboxy polymer used in the binder of the present invention comprises an organic polymer or oligomer containing more than one pendant carboxy group. The polycarboxy polymer may be a homopolymer or copolymer prepared from unsaturated carboxylic acids including but not necessarily limited to, acrylic acid, methacrylic acid, crotonic acid, isocrotonic acid, maleic acid, cinnamic acid, 2-methylmaleic acid, itaconic acid, 2-methylitaeonic acid, α,β-methyleneglutaric acid, and the like. Alternatively, the polycarboxy polymer may be prepared from unsaturated anhydrides including, but not necessarily limited to, maleic anhydride, methacrylic anhydride, and the like, as well as mixtures thereof. Methods for polymerizing these acids and anhydrides are well-known in the chemical art.

The polycarboxy polymer of the present invention may additionally comprise a copolymer of one or more of the aforementioned unsaturated carboxylic acids or anhydrides and one or more vinyl compounds including, but not necessarily limited to, styrene, α-methylstyrene, aorylonitrile, methacrylonitrile, methyl acrylate, ethyl acrylate, n-butyl acrylate, isobutyl acrylate, methyl methacrylate, n-butyl methacrylate, isobutyl methacrylate, blycidyl methacrylate, vinyl methyl ether, vinyl acetate, and the like. Methods for preparing these copolymers are well-known in the art.

Preferred polycarboxy polymers for the purposes of the present invention comprise homopolymers and copolymers of polyacrylic acid. It is also most preferred that the polymer used, and in particular the polyacrylic acid polymer used, be of a low molecular weight less than 10,000, preferably 5000 or less, more preferably 3000 or less, and most preferably about 2000. Combining the low molecular weight polymer with the hydroxyl/carboxy equivalents ratio results in a binder which presents few processing difficulties and a product, particularly a fiberglass product, with excellent properties.

The formaldehyde-free curable aqueous binder composition of the present invention also contains a polyol containing at least two hydroxyl groups. The polyol must be sufficiently nonvolatile such that it will substantially remain available for reaction with the polyacid in the composition during heating and curing operations. The polyol may be a compound with a molecular weight less than about 1000 bearing at least two hydroxyl groups such as, for example, ethylene glycol, glycerol, pentaerythritol, trimethylol propane, sorbitol, sucrose, glucose, resoreinol, catechol, pyrogallol, glycollated ureas, 1,4-cyclohexane diol, diethanolamine, triethanolamine, and certain reactive polyols such as, for example, β-hydroxyalkylamides such as, for example, bis[N,N-di(β-hydroxyethyl)]adipamide, as may be prepared according to the teachings of U.S. Pat. No. 4,076,917, hereby incorporated herein by reference, or it may be an addition polymer containing at least two hydroxyl groups such as, for example, polyvinyl alcohol, partially hydrolyzed polyvinyl acetate, and homopolymers or copolymers of hydroxyethyl (meth) acrylate, hydroxypropyl(meth) acrylate, and the like. The most preferred polyol for the purposes of the present invention is triethanolamine (TEA).

In an important aspect of the present invention, the ratio of the number of equivalents of hydroxyl groups from the polyol to the number of equivalents of carboxy, anhydride, or salts thereof of the polyacid is high and narrowly defined. It is preferred that the ratio is in the range of from about 0.4/1 to about 1.0/1 and more preferably in the range of from about 0.6/1 to about 0.8/1. In a preferred embodiment, the range is from about 0.65/1 to about 0.75/1. An excess of equivalents of carboxy, anhydride, or salts thereof of the polyacid to the equivalents of hydroxyl from the polyol is required, with the stoichiometry of the polyol being such that the number of equivalents of hydroxyl in the polyol is such that it is most preferably about 60–80%, and more preferably 65–75%, and most preferably about 70% of the equivalents of carboxy units. For it has been found that for the low molecular weight polycarboxy polymers, the ratio should approach 0.7 as the molecular weight is reduced. Otherwise, property loss is observed. Thus, as the molecular weight of the polycarboxy polymer approaches 2000, the ratio should approach 0.7/1 for the most advantageous results.

The formaldehyde-free curable aqueous binder composition of the present invention also preferably contains a catalyst. Most preferably, the catalyst is a phosphorous-containing accelerator which may be a compound with a molecular weight less than about 1000 such as, for example, an alkali metal polyphosphate, an alkali metal dihydrogen phosphate, a polyphosphoric acid, and an alkyl phosphinic acid or it may be an oligomer or polymer bearing phosphorous-containing groups such as, for example, addition polymers of acrylic and/or maleic acids formed in the presence of sodium hypophosphite, addition polymers prepared from ethylenically unsaturated monomers in the presence of phosphorous salt chain transfer agents or terminators, and addition polymers containing acid-functional monomer residues such as, for example, copolymerized phosphoethyl methacrylate, and like phosphonic acid esters, and copolymerized vinyl sulfonic acid monomers, and their salts. The phosphorous-containing accelerator may be used at a level of from about 1% to about 40%, by weight based on the combined Weight of the polyacid and the polyol. Preferred is a level of phosphorous-containing accelerator of from about 2.5% to about 10%, by weight based on the combined weight of the polyacid and the polyol.

The formaldehyde-free curable aqueous binder composition may contain, in addition, conventional treatment components such as, for example, emulsifiers, pigments, filler, anti-migration aids, curing agents, coalescents, wetting agents, biocides, plasticizers, organosilanes, anti-foaming agents, colorants, waxes, and anti-oxidants.

The formaldehyde-free curable aqueous binder composition may be prepared by admixing the polyacid, the polyol, and the phosphorous-containing accelerator using conventional mixing techniques. In another embodiment, a carboxyl- or anhydride-containing addition polymer and a polyol may be present in the same addition polymer, which addition polymer would contain both carboxyl, anhydride, or salts thereof functionality and hydroxyl functionality. In another embodiment, the salts of the carboxy-group are salts of functional alkanolamines with at least two hydroxyl groups such as, for example, diethanolamine, triethanolamine, dipropanolamine, and di-isopropanolamine. In an additional embodiment the polyol and the phosphorous-containing accelerator may be present in the same addition polymer, which addition polymer may be mixed with a polyacid. In yet another embodiment the carboxyl- or anhydride-containing addition polymer, the polyol, and the phosphorous-containing accelerator may be present in the same addition polymer. Other embodiments will be apparent to one skilled in the art. As disclosed herein-above, the carboxyl groups of the polyacid may be neutralized to an extent of less than about 35% with a fixed base before, during, or after the mixing to provide the aqueous composition. Neutralization may be partially effected during the formation of the polyacid.

The formaldehyde-free curable aqueous composition may be applied to a nonwoven by conventional techniques such as, for example, air or airless spraying, padding, saturating, roll coating, curtain coating, beater deposition, coagulation, or the like.

The waterborne formaldehyde-free composition, after it is applied to a nonwoven, is heated to effect drying and curing. The duration and temperature of heating will affect the rate of drying, processability and handleability, and property development of the treated substrate. Heat treatment at about 120° C., to about 400° C., for a period of time between about 3 seconds to about 15 minutes may be carried out; treatment at about 150° C., to about 250° C., is preferred. The drying and 10 curing functions may be effected in two or more distinct steps, if desired. For example, the composition may be first heated at a temperature and for a time sufficient to substantially dry but not to substantially cure the composition and then heated for a second time at a higher temperature and/or for a longer period of time to effect curing. Such a procedure, referred to as "B-staging", may be used to provide binder-treated nonwoven, for example, in roll form, which may at a later stage be cured, with or without forming or molding into a particular configuration, concurrent with the curing process.

More particularly, in the preparation of fiberglass insulation products, the products can be prepared using conventional techniques. As is well known, a porous mat of fibrous glass can be produced by fiberizing molten glass and immediately forming a fibrous glass mat on a moving conveyor.

The mat is then conveyed to and through a curing oven wherein heated air is passed through the mat to cure the resin. The mat is slightly compressed to give the finished product a predetermined thickness and surface finish. Typically, the curing oven is operated at a temperature from about 150° C. to about 325° C. Preferably, the temperature ranges from about 180° to about 250° C. Generally, the mat resides within the oven for a period of time from about ½ minute to about 3 minutes. For the manufacture of conventional thermal or acoustical insulation products, the time ranges from about 1 minute to about 2½ minutes. The fibrous glass, having a cured, rigid binder matrix, emerges form the oven in the form of a bat which may be compressed for packaging and shipping and which will thereafter substantially recover its vertical dimension when unconstrained.

The heat-resistant nonwovens may be used for applications such as, for example, insulation batts or rolls, as reinforcing or insulation mat for roofing or flooring applications, as roving, as microglass-based substrate for printed circuit boards or battery separators, as filter stock, as tape stock, as tack board for office petitions, in duct liners or duct board, and as reinforcement scrim in cementitious and non-cementitious coatings for masonry.

EXAMPLE

A list of resins applied and their properties is shown in Table 1. The resins were inline mixed with a solution containing a yellow dye and an appropriate quantity of an amino silane (Osi A1101), and a soft water stream. These components were then delivered to six sets of twelve spraying nozzles where they were hydraulically dispersed. The nozzles were arranged in six circles spraying the binders towards the center of the freshly formed fiberglass from a distance of about 8 inches. The fiberglass was manufactured using a standard fiberglass spinning machine located approximately 12 inches above each circle of nozzles. The fiberglass production and binder spray rates were kept constant such that the final cured binder content represented about 5.5 weight % of the finished product. Of that cured binder content approximately 0.2% represented the silane. The final solids content of the binders as sprayed was around 10%.

Mat moistures at the exit of the forming chamber were measured for each set point (Table 2). This gives a gauge of the dry down rate of each binder. High ramp moisture has been linked to improved product performance.

Binder flow was increased until some signs of under-cure showed up and then slightly reduced. Ramp moistures were measured in excess of 5% when problems were encountered.

The recoveries and droops for each of the samples were analyzed with a two tailed t-test in which early set points were compared to the early control and later set points were compared to the later control. The controls were also compared to determine whether any changes had occurred during the day. Where a significant difference exists (95% confidence), it is indicated with a plus or minus. The results are shown in Table 3.

Generally, there are no significant differences in recovery or droop between TEA levels on the lower level product. Upper level recoveries and droops indicate better product performance with the higher TEA level for both resins B and D. In theory, the shorter polymer chains require more crosslinks to achieve the same mechanical properties as longer chain polymers with fewer crosslinks. Laboratory studies of crosslinker stoichiometry vs. mechanical strength of the binder indicate this to be true. A crosslinker level of approximately 70% should be used with these low molecular weight acrylic resins.

From the results, it can be concluded that building insulation can be produced with acrylic resins that are essentially emission free and formaldehyde free. This product can be produced to meet recovery specifications and have equal or better droop than standard phenolic product.

Within the family of acrylic resins (available from Rohm and Haas) the lower molecular weights present fewer processing difficulties. Collection box fiber accumulation is reduced with these acrylic variants. High binder flow rates are still beneficial to product performance. Material handling and pumping of the low molecular weight products are improved over resin A (10,000 Daltons M.W), especially in cold weather. The lowest molecular weight resin (resin D) with higher TEA stoichiometry (70%) gave the best acrylic bonded product performance (recovery and droop).

TABLE 1

Resin Properties

| Resin | % Solids | Molecular Weight | TEA Stoichiometry | Viscosity (25° C., 40%) |
|---|---|---|---|---|
| A | 40% | 10000 Daltons | 45% | 240 cP |
| B | 51% | 4500 Daltons | 45% | 100 cP |
| C | 45% | 3500 Daltons | 45% | 60 cP |
| D | 41% | 2100 Daltons | 55% | 20 cP |
| Phenolic | 48% | 1000 Daltons | NA | 4 cP |

TABLE 2

Let-Down Ramp Moistures

| Sample No. Test Point | 1 % Moisture | 2 % Moisture | 3 % Moisture | Average % Moisture |
|---|---|---|---|---|
| 0 | 2.82% | 2.79% | 2.32% | 2.64% |
| X1 | 0.89% | 0.90% | 0.89% | 0.89% |
| X2 | 2.03% | 2.41% | 1.60% | 2.01% |
| X2B | 5.74% | 8.08% | 3.20% | 5.67% |
| X4 | 2.56% | 3.51% | 2.15% | 2.74% |
| X3 | 1.84% | 3.03% | 2.18% | 2.35% |
| X5 | 4.41% | 5.97% | 3.20% | 4.53% |
| X7 | 4.42% | 2.88% | 4.01% | 3.77% |
| X8 | 3.83% | 3.92% | 2.79% | 3.51% |
| X11 | 2.52% | 2.75% | 1.77% | 2.35% |
| T1 | 7.04% | 6.59% | 9.72% | 7.78% |
| T2A | 5.86% | 6.96% | 10.24% | 7.69% |
| T2B | 4.10% | 4.73% | 5.33% | 4.72% |

TABLE 3

Product Performance Data
Product Performance Results

| Binder | setpoint | Quick upper level recovery | | upper level droop | | lower level recovery | | lower level droop | |
|---|---|---|---|---|---|---|---|---|---|
| Phenolic Control | X1 | 7.44 | 0 | 2.73 | 0 | 7.02 | 0 | 1.98 | 0 |
| Phenolic Control | X11 | 7.25 | − | 3.08 | 0 | 6.83 | − | 2.67 | − |
| Resin D/55% TEA | X2 | 6.48 | − | 2.68 | 0 | 6.99 | 0 | 2.56 | − |
| Resin D/55% TEA | X2B | 6.88 | − | 1.53 | + | 6.96 | 0 | 2.02 | 0 |
| Resin D/70% TEA | X3 | 6.89 | − | 1.71 | + | 7.00 | 0 | 1.98 | 0 |
| Resin D/55% TEA/pH = 3.2 | X4 | 6.93 | − | 1.60 | + | 6.93 | 0 | 1.73 | 0 |
| Resin C/45% TEA | X5 | 6.95 | − | 2.00 | + | 6.94 | + | 1.94 | + |
| Resin B/45% TEA | X7 | 7.08 | 0 | 1.86 | + | 6.93 | 0 | 1.94 | + |

TABLE 3-continued

Product Performance Data
Product Performance Results

| | | | | | | | | |
|---|---|---|---|---|---|---|---|---|
| Resin B/70% TEA | X8 | 7.13 | − | 1.65 | + | 6.92 | 0 | 2.10 | + |

| Binder | | One Week setpoint upper level recovery | | upper level droop | | lower level recovery | | lower level droop | |
|---|---|---|---|---|---|---|---|---|---|
| Phenolic Control | X1 | 7.21 | 0 | 3.62 | 0 | 6.93 | 0 | 3.06 | 0 |
| Phenolic Control | X11 | 6.82 | − | 3.84 | 0 | 6.52 | − | 3.96 | − |
| Resin D/55% TEA | X2 | 6.52 | − | 3.14 | 0 | 6.60 | − | 3.79 | − |
| Resin D/55% TEA | X2B | 6.34 | − | 2.73 | 0 | 6.55 | − | 2.54 | + |
| Resin D/70% TEA | X3 | 6.67 | − | 2.14 | + | 6.58 | − | 3.42 | − |
| Resin D/55% TEA/pH = 3.2 | X4 | 6.67 | − | 2.40 | + | 6.53 | − | 2.54 | + |
| Resin C/45% TEA | X5 | 6.54 | | 2.68 | | 6.19 | − | 3.96 | 0 |
| Resin B/45% TEA | X7 | 6.48 | | 2.94 | | 6.42 | 0 | 3.12 | + |
| Resin B/70% TEA | X8 | 6.78 | | 2.30 | | 6.51 | 0 | 3.29 | + |

| Binder | | One Month setpoint upper level recovery | | upper level droop | | lower level recovery | | lower level droop | |
|---|---|---|---|---|---|---|---|---|---|
| Phenolic Control | X1 | 7.03 | | 3.97 | | 6.86 | 0 | 3.17 | |
| Phenolic Control | X11 | 6.84 | | 4.51 | | 6.59 | − | 4.77 | − |
| Resin D/55% TEA | X2 | 6.12 | | 4.52 | | 6.59 | − | 4.37 | − |
| Resin D/55% TEA | X2B | 6.09 | | 3.18 | | 6.57 | − | 3.21 | 0 |
| Resin D/70% TEA | X3 | 6.32 | | 3.29 | | 6.55 | − | 3.64 | − |
| Resin D/55% TEA/pH = 3.2 | X4 | 6.42 | | 2.68 | | 6.49 | − | 2.96 | 0 |
| Resin C/45% TEA | X5 | 6.35 | | 3.46 | | 6.33 | − | 3.95 | + |
| Resin B/45% TEA | X7 | 6.25 | | 3.48 | + | 6.45 | 0 | 3.31 | + |
| Resin B/70% TEA | X8 | 6.50 | | 2.82 | | 6.38 | − | 3.83 | 0 |

| Binder | | Three Month setpoint upper level recovery | | upper level droop | | lower level recovery | | lower level droop | |
|---|---|---|---|---|---|---|---|---|---|
| Phenolic Control | X1 | 7.05 | | 3.47 | | 6.67 | 0 | 3.50 | 0 |
| Phenolic Control | X11 | 6.65 | | 5.26 | | 6.38 | − | 5.08 | − |
| Resin D/55% TEA | X2 | 6.25 | | 4.51 | | 6.42 | − | 5.19 | − |
| Resin D/55% TEA | X2B | 5.96 | | 4.60 | | 6.22 | − | 4.27 | 0 |
| Resin D/70% TEA | X3 | 6.23 | | 3.40 | | 6.25 | − | 4.71 | − |
| Resin D/55% TEA/pH = 3.2 | X4 | 6.32 | | 3.03 | | 6.30 | − | 3.66 | 0 |
| Resin C/45% TEA | X5 | 6.29 | | 3.91 | | 6.20 | − | 4.00 | + |
| Resin B/45% TEA | X7 | 6.23 | | 3.75 | | 6.29 | 0 | 4.04 | + |
| Resin B/70% TEA | X8 | 6.46 | | 3.33 | + | 6.01 | − | 5.44 | 0 |

+, 0, − stand for better, same, worse than control respectively (95% confidence), all measurements are in inches While the invention has been described with preferred embodiments, it is to be understood that variations and modifications may be resorted to as will be apparent to those skilled in the art. Such variations and modifications are to be considered within the purview and the scope of the claims appended hereto.

What is claimed is:

1. A duct liner comprised of a fiberglass mat prepared with a fiberglass binder comprising an aqueous solution of
   a) a polycarboxy polymer having a number average molecular weight of 5000 or less, and
   b) a polyol with the amount of polycarboxy polymer and polyol in the binder being such that the ratio of equivalents of hydroxyl groups to equivalents of carboxy groups is in the range of from 0.6/1 to 0.8/1, and with the viscosity of the binder solution, at 25° C. in 40% solids, ranging from about 20 cP to about 100 cP.

2. The duct liner of claim 1, wherein the fiberglass binder comprises a polycarboxy polymer having a number average molecular weight of about 3000 or less.

3. The duct liner of claim 1, wherein the polyol of the fiberglass binder is triethanolamine.

4. The duct liner of claim 1, wherein the polycarboxy polymer of the fiberglass binder comprises a homopolymer or copolymer of polyacrylic acid.

5. The duct liner of claim 1, wherein the ratio of equivalents of hydroxyl groups to equivalents of carboxy groups in the fiberglass binder is in the range of from about 0.6/1 to about 0.7/1.

6. The duct liner of claim 5, wherein the ratio of equivalents of hydroxyl groups to equivalents of carboxy groups in the fiberglass binder is in the range of from about 0.65/1 to about 0.75/1.

7. The duct liner of claim 1, wherein the fiberglass binder used in its preparation further comprises a catalyst comprised of sodium hypophosphite, sodium phosphite, or mixtures thereof.

8. A duct board comprised of nonwoven fiberglass and a binder, with the fiberglass binder comprising
   a) a polycarboxy polymer having a number average molecular weight of 5000 or less, and
   b) a polyol with the amount of polycarboxy polymer and polyol in the binder being such that the ratio of equivalents of hydroxyl groups to equivalents of carboxy groups is in the range of from 0.6/1 to 0.8/1, and with the fiberglass binder in aqueous solution having a viscosity of the binder solution, at 25° C. in 40% solids, ranging from about 20 cP to about 100 cP.

9. The duct board of claim 8, wherein the fiberglass binder comprises a polycarboxy polymer having a number average molecular weight of about 3000 or less.

10. The duct board of claim 8, wherein the polyol of the fiberglass binder is triethanolamine.

11. The duct board of claim 8, wherein the polycarboxy polymer of the fiberglass binder comprises a homopolymers or copolymer of polyacrylic acid.

12. The duct board of claim 8, wherein the ratio of equivalents of hydroxyl groups to equivalents of carboxy groups in the fiberglass binder is in the range of from about 0.6/1 to about 0.7/1.

13. The duct board of claim 12, wherein the ratio of equivalents of hydroxyl groups to equivalents of carboxy groups in the fiberglass binder is in the range of from about 0.65/1 to about 0.75/1.

14. The duct board of claim 8, wherein the fiberglass binder further comprises a catalyst comprised of sodium hypophosphite, sodium phosphite, or mixtures thereof.

* * * * *